United States Patent [19]

D'Anci

[11] Patent Number: 4,591,831

[45] Date of Patent: May 27, 1986

[54] POSITION ANGLE TRANSDUCER FOR TAP CHANGING TRANSFORMERS

[75] Inventor: Alexander D'Anci, Springvale, Me.

[73] Assignee: Intelligent Controls, Inc., Saco, Me.

[21] Appl. No.: 608,128

[22] Filed: May 8, 1984

[51] Int. Cl.[4] .......................... G05F 1/153; H02J 3/12; H03M 7/28

[52] U.S. Cl. .............................. 340/347 SY; 323/257; 323/341

[58] Field of Search ................. 340/347 SY; 323/257, 323/341

[56] References Cited

U.S. PATENT DOCUMENTS 3,827,045 7/1974 Markus ......................... 340/347 SY 4,114,035 9/1978 Herzog ............................ 340/347 P

*Primary Examiner*—L. T. Hix

*Assistant Examiner*—David M. Gray

*Attorney, Agent, or Firm*—Daniel H. Kane, Jr.

[57] ABSTRACT

A position angle transducer for voltage compensating tap changing transformers provides secondary tap number or tap position analog output signals which accurately reflect the secondary tap position even if a nonlinear relationship obtains between the shaft angle and tap number. A shaft angle sensor generates shaft angle analog signals and an analog-to-digital converter converts the shaft angle analog signals to shaft angle digital words. A digital-to-digital converter receives the shaft angle digital words and provides at its output tap number digital words according to the transfer function or functional relationship of tap changing shaft angle to tap number for the particular transformer. A programmable read-only memory performs the digital-to-digital conversion and is flexibly programmed according to the transfer function of the transformer and in order to establish any desired transfer functional relationship. The tap number digital words may then be converted to tap number analog signals at the output truly representative of the secondary tap position for input to a utility company SCADA System.

23 Claims, 13 Drawing Figures

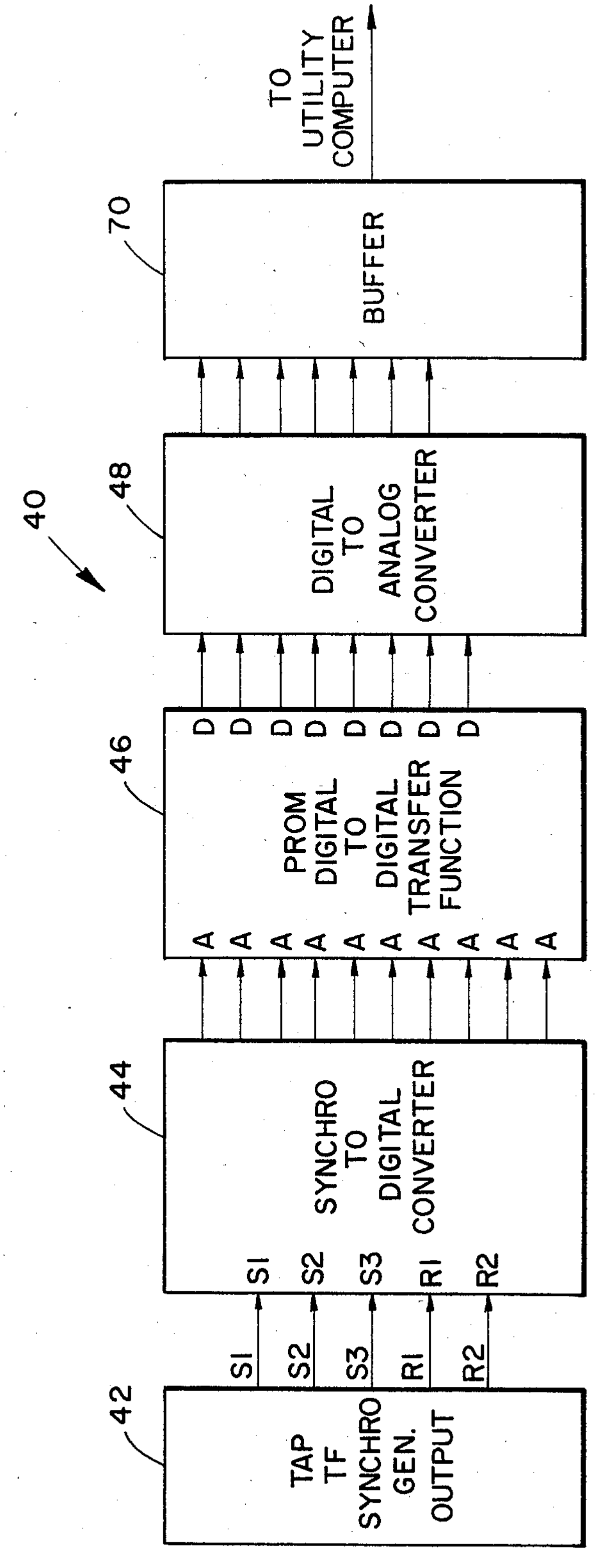
FIG. I

| TAP POS | DEGREES FROM HOME Ø | mA |
|---|---|---|
| 1 | -165 | -0.9 |
| 2 | -153 | -0.8 |
| 3 | -130 | -0.7 |
| 4 | -110 | -0.6 |
| 5 | -102 | -0.5 |
| 6 | -74 | -0.4 |
| 7 | -40 | -0.3 |
| 8 | -26 | -0.2 |
| 9 | -13 | -0.1 |
| 10 | 0 HOME | 0 |
| 11 | +13 | +0.1 |
| 12 | +29 | +0.2 |
| 13 | +63 | +0.3 |
| 14 | +86 | +0.4 |
| 15 | +102 | +0.5 |
| 16 | +116 | +0.6 |
| 17 | +132 | +0.7 |
| 18 | +144 | +0.8 |
| 19 | +159 | +0.9 |

PAT TRANSDUCER OUTPUT

POSITION ANGLE TRANSDUCER FOR TAP CHANGING TRANSFORMERS

TECHNICAL FIELD

This invention relates to an improved position angle transducer for voltage compensating variable tap or tap changing transformers. The improved position angle transducer or PAT is particularly applicable for tap changing transformers used by utility power companies.

BACKGROUND ART

Voltage compensating tap changing transformers are used by utility power companies in power substations to respond to varying load demand by electric power consumers. Such variable tap or tap changing transformers are voltage compensating transformers whose secondary tap may be changed in response to varying demand in power consumption in order to maintain substantially constant output voltage.

Tap changing transformers generally have a rotatable shaft for changing the secondary tap of the transformer to different secondary tap positions or tap numbers by rotation of the shaft. A shaft motor rotates the shaft through different tap changing shaft angles in response to control signals.

According to the state of the art the position angle transducer comprises a shaft angle sensor for generating shaft angle analog signals corresponding to the tap changing shaft angles. Typically the shaft angle sensor is a synchronous generator having rotor and stator coils operatively coupled for generating rotor and stator synchro signals corresponding to the tap changing shaft angle. Alternatively, the shaft angle sensor may be a resolver having rotor and stator coils coupled for generating resolver signals corresponding to the tap changing shaft angle.

The shaft angle analog signals are used by the utility power companies to provide information on the secondary tap positions or tap numbers of the respective substation transformers. This information is useful in utility load planning and may provide input data to the Supervisory Control and Data Acquisition (SCADA) System of the utility company. The SCADA System in turn can provide control signals to the respective shaft angle prime movers or motors of the transformers.

A difficulty is encountered with present position angle transducers if the relationship between the tap changing shaft angle and the tap number or tap position is non-linear for a particular tap changing transformer. That is, a change in the shaft angle may not result in a proportionate change in tap number or tap position. In that event, the utility company cannot rely upon the shaft angle analog signals to reflect the operative secondary tap position or tap number of the transformer.

Furthermore, the transfer function or functional relationship of shaft angle to tap number may vary with different transformers from different manufacturers or even between transformers from the same manufacturer. The conventional position angle transducers suffer from this transfer function variability between the actual tap numbers and the shaft angle analog signals input to the SCADA System.

OBJECTS OF THE INVENTION

It is therefore an object of the present invention to provide a flexible transfer function position angle transducer capable of accurately converting shaft angle analog signals to corresponding tap number or tap position data signals for any particular transformer.

Another object of the invention is to provide an improved position angle transducer capable of transforming the transfer functional relationship of shaft angle and tap number for a particular transformer to a linear transfer function or to any other desired functional relationship.

A further object of the invention is to provide an improved position angle transducer which is programmable according to the transfer function of a particular transformer for yielding accurate tap position or tap number data signals from shaft angle analog signals and for transforming the transfer function to any desired functional relationship.

DISCLOSURE OF THE INVENTION

In order to accomplish these results the invention provides an improved position angle transducer for tap changing transformers comprising an analog-to-digital converter having a plurality of inputs operatively coupled to receive the shaft angle analog signals from the shaft angle sensor and a plurality of outputs for delivering digital words. The analog-to-digital converter is programmed to deliver shaft angle digital words at the outputs corresponding to the shaft angle analog signals and therefore the tap changing shaft angles of the tap changing transformer.

The invention also provides a digital-to-digital converter having a plurality of inputs coupled to receive the shaft angle digital words and a plurality of outputs for delivering tap number digital words. A feature and advantage of this arrangement is that the digital-to-digital converter is operatively programmable for converting the shaft angle digital words to tap number digital words according to the transfer function or functional relationship of shaft angle to tap number for the particular tap changing transformer. A final digital-to-analog converter may also be provided for receiving the tap number digital words and delivering tap number analog signals through a suitable output buffer to the SCADA System.

In the preferred embodiment the digital-to-digital converter is a programmable read-only memory (PROM) programmed according to the transfer function or functional relationship of shaft angle to tap number for the particular transformer. The PROM provides a transfer function memory having a plurality of shaft angle digital word address inputs and memory locations. The tap number digital words are stored at the shaft angle digital word address memory locations. The tap number digital words represent the tap numbers corresponding to the tap changing shaft angles of the transformer.

As a result, the new position angle transducer provides accurate tap number data signals at the output corresponding to the transformer shaft angle analog signals for any functional relationship, linear or non-linear between shaft angle and tap number for the particular transformer. Furthermore, the PROM can be programmed to establish any desired transfer function relationship, for example, to concentrate the tap position data in a smaller arc, change the home position, insert a "dead space" in the dial, or change the slope of the transfer function. An algorithm is provided for deriving the contents of the PROM given the shaft angle data versus tap number data for a particular transformer or other transfer function requirements.

BRIEF DESCRIPTION OF DRAWINGS

FIG. 1 is a block diagram of a position angle transducer for tap changing transformers according to the invention using synchronous generator shaft angle signals at the input to generate corresponding tap number analog signals at the output.

DESCRIPTION OF PREFERRED EXAMPLE EMBODIMENT AND BEST MODE OF THE INVENTION

Figure 1A:
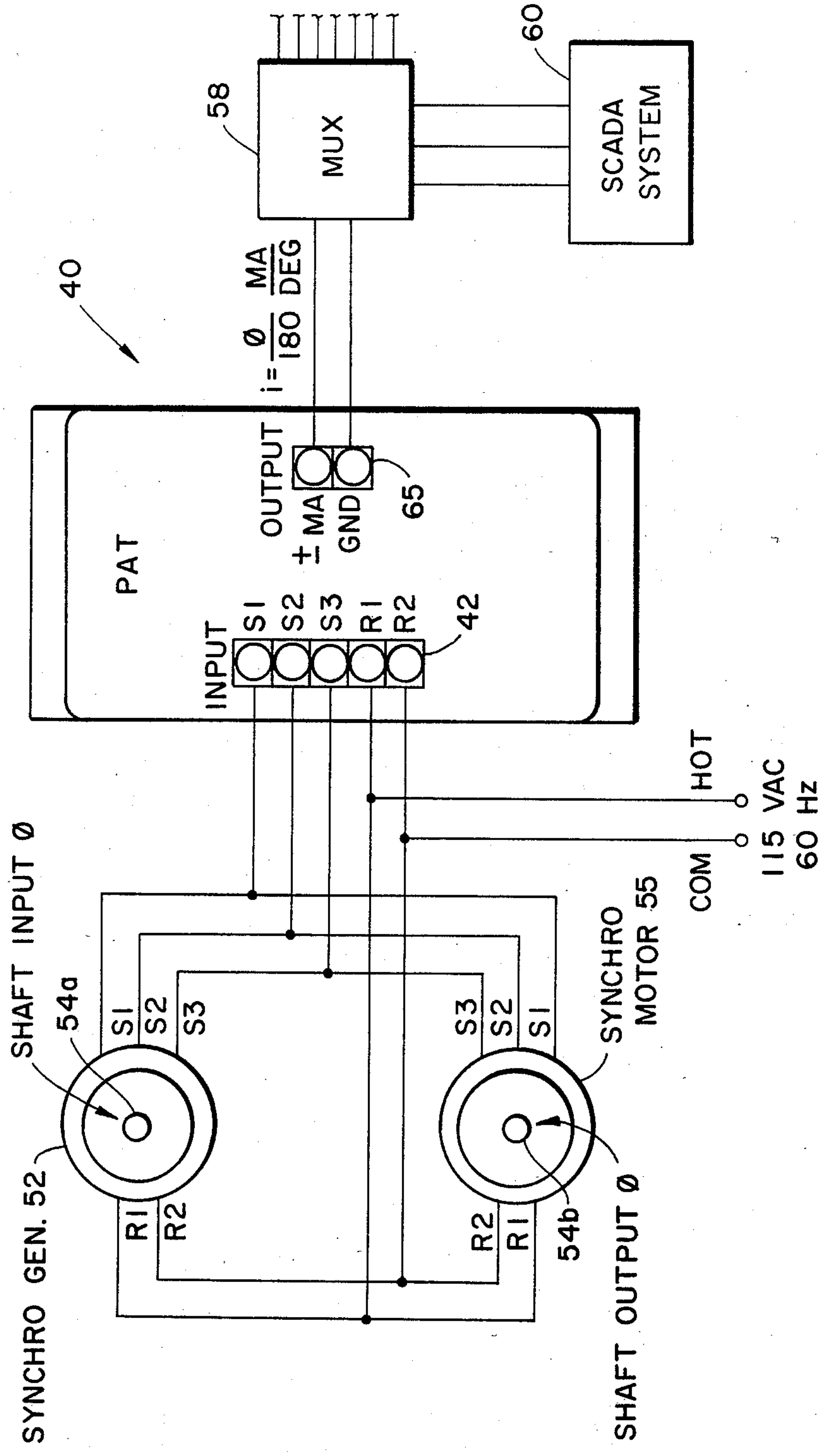
FIG. 1A is a schematic diagram showing the coupling of a tap changing transformer synchronous generator and optional synchronous motor coupled to the position angle transducer.

The improved position angle transducer 40 for tap changing transformers is shown in the block diagrams of FIGS. 1 and 1A. Shaft angle analog synchro signals S1, S2, and S3 and synchro reference rotor signals R1 and R2 at terminal strip 42, derived from the synchronous generator of a tap changing transformer are input to the synchro-to-digital converter 44. The synchro-to-digital converter 44 converts the phase and amplitude information from the shaft angle analog synchro stator and rotor signals to a ten bit digital word using a high accuracy control transformer algorithm. The ten bit digital word is applied to the address inputs A of PROM 46 which functions as a digital-to-digital converter delivering an 8 bit tap position or tap number digital word on the output lines D. The tap number digital word on output lines D is derived from the shaft angle digital word address memory location of PROM or EPROM 46 corresponding to the shaft angle digital word address on input lines A. The PROM is previously programmed as hereafter described correlating in this manner the tap number digital words and shaft angle digital words according to the transfer function of the particular tap changing transformer. The tap number digital word on output lines D is applied to digital-to-analog converter 48 to provide tap number analog signals at output buffer 70, all as hereafter described.

As shown in FIG. 1A, the shaft angle analog signals are derived from the synchronous generator 52 whose rotor coils and shaft 54*a* are coupled to rotate with the shaft of the tap changing transformer not shown. The stator coils of synchronous generator 52 remain stationary relative to the rotating shaft and rotor coils. The three stator coils are coupled in a delta configuration and the synchro signals or stator signals S1, S2, S3 are derived from the nodes of the delta network. One of the rotor coils is connected to the 120 volt 60 cycle AC hot side of the utility power company line voltage to provide the reference signal R1 while the other rotor coil is connected to the common, ground or neutral side to provide reference signal R2. Thus, the rotor coils provide the rotor reference signals R1 and R2. The synchro stator signals S1, S2, and S3 and the rotor reference signals R1 and R2 are applied to the terminal strip 42 of the PAT 40. The analog signals at input terminal strip 42 of PAT 40 represent shaft angle analog signals while the analog signals at the output terminal strip 65 of PAT 40 represent tap position or tap number analog signals. In the detailed example hereafter described the tap number analog signal is a current signal in the range of, for example, $-1$ mA to $+1$ mA for tap changing shaft angles $\phi$ of the shaft of the tap changing transformer from 0° to $\pm 180°$. The tap number analog output signal is then available to the SCADA System 60 through multiplexer MUX 58.

An optional synchronous motor 55 may be included with the synchronous generator 42 having rotor and stator coils in parallel coupling with the synchronous generator 52. The rotor coils and synchronous motor shaft 54*b* are similarly driven in step with the shaft of the tap changing transformer. The synchro motor 55 is used to drive a standard dial indicator not shown to provide a direct reading of shaft angle according to the angular position of a pointer on the dial. The synchronous motor and dial can provide a direct reading of shaft angle and tap number where a linear functional relationship obtains between shaft angle and tap position or tap number. However, where the tap changing transformer is characterized by a non-linear relationship of shaft angle to tap number, the synchronous motor and dial accurately provide a direct reading of shaft angle only.

Figure 2:
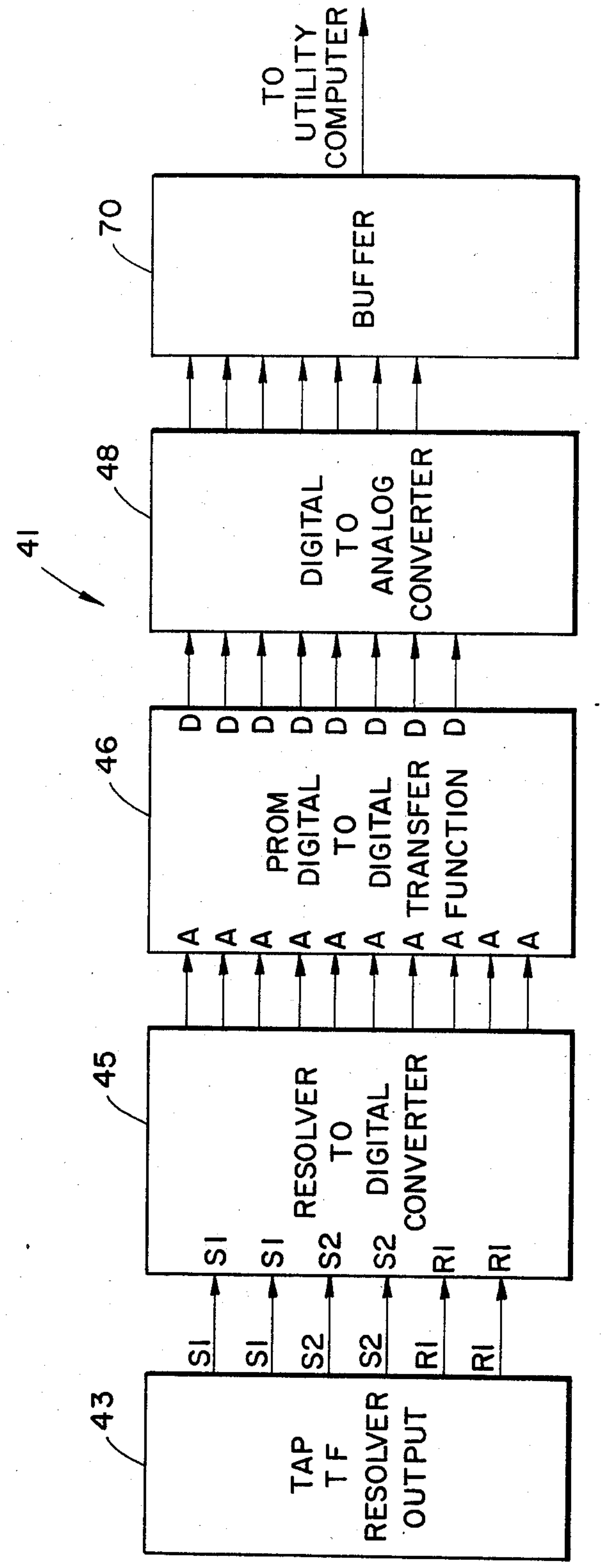
FIG. 2 is a block diagram of a position angle transducer for tap changing transformers according to the invention using resolver shaft angle analog signals at the input to generate corresponding tap number analog signals at the output.

An alternative position angle transducer 41 according to the invention is illustrated in the block diagram of FIG. 2. Stator and rotor analog signals from a resolver coupled to the shaft of a tap changing transformer are available at the terminal strip 43. The resolver shaft angle sensor differs from the synchronous generator shaft angle sensor of FIGS. 1 and 1A. The resolver generally includes a single rotor coil on the rotor coupled to rotate with the transformer shaft, with two leads providing the inputs R1 from terminal strip 43. The stator includes two separately coupled stator coils, each with two leads providing the S1 inputs and S2 inputs from the the terminal strip 43. The resolver thus provides six shaft angle analog signals from three coils coupled to the input of the resolver-to-digital converter 45. The resolver-to-digital converter 45 converts the stator and rotor signals from the resolver to a digital word in turn coupled to the address inputs of PROM 46 as hereafter described. The remainder of the PAT follows the description of the block diagram of FIG. 1 with the same reference numerals applied to corresponding components.

Figure 3:
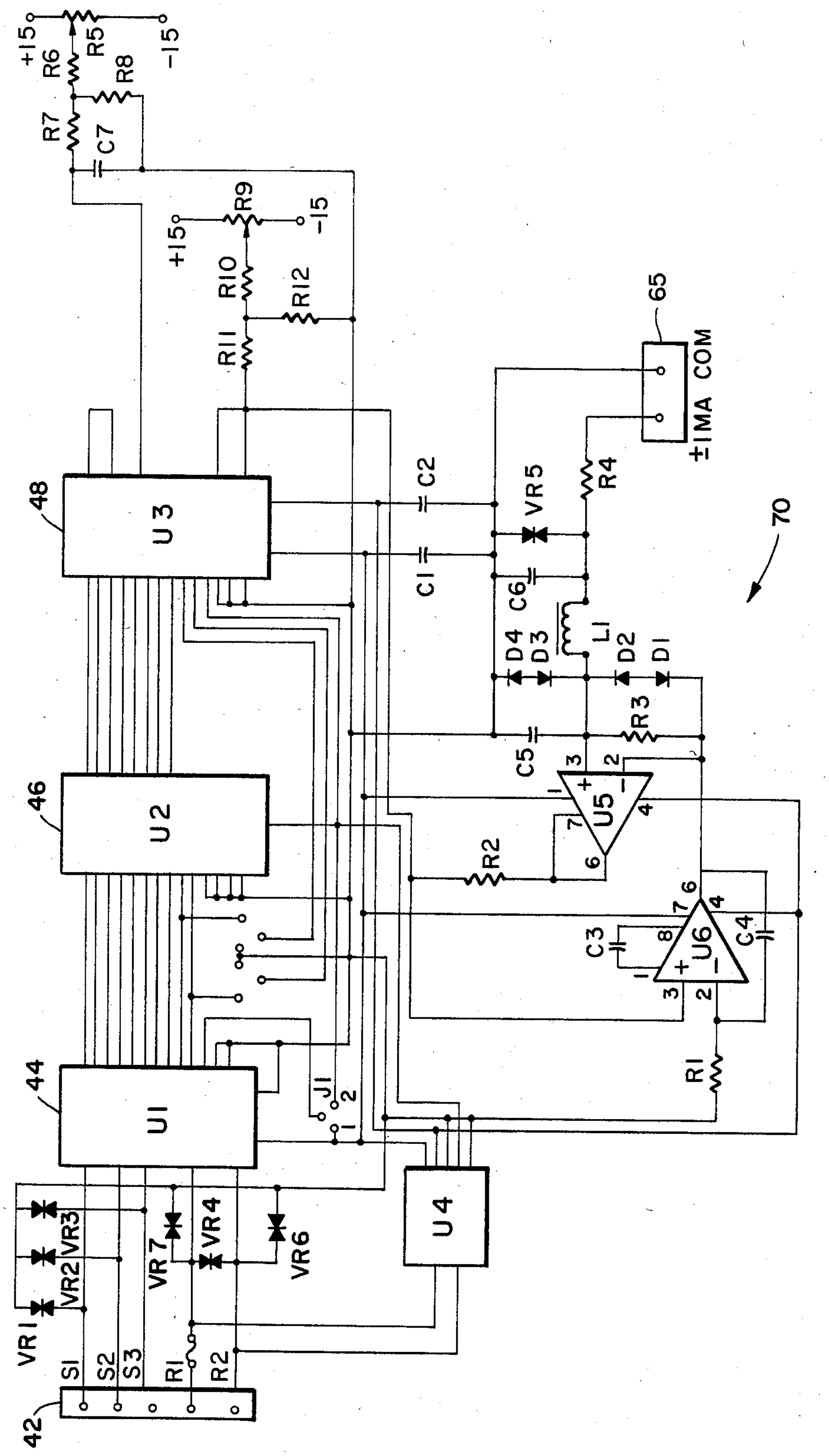
FIG. 3 is a detailed schematic diagram of a position angle transducer according to the invention for implementing the block diagram of FIG. 1.

A detailed schematic circuit implementing the block diagram of FIG. 1 is illustrated in FIG. 3 with corresponding elements similarly numbered. Metal oxide varistors VR1, VR2, and VR3, which may be, for example, V95LA7B varistors are provided at the stator signal inputs S1, S2, and S3 for clamping the voltage and protecting the synchro-to-digital converter 44 from voltage transients. Similarly, varistors VR4, VR6, and VR7 which may be, for example, V150LA10A varistors are coupled in a cluster at the rotor inputs R1 and R2 for clamping the voltage and protecting from voltage transients.

The synchro-to-digital converter 44, also designated U1, is an integrated hybrid circuit SDC 19103-301 available, for example, from ILC Data Devices, Bohemia, N.Y. A resolver-to-digital converter IC is also available from this source. The PROM 46, also referred to as U2, is a generic designation 2716 programmable read-only memory available, for example, from Intel, Hitachi or Motorola. The digital-to-analog converter 48, also designated U3, is an IC chip, for example HS DAC 80 CBI-I, available from Hybrid Systems, Massachusetts, or Burr-Brown, Massachusetts.

Figure 4:
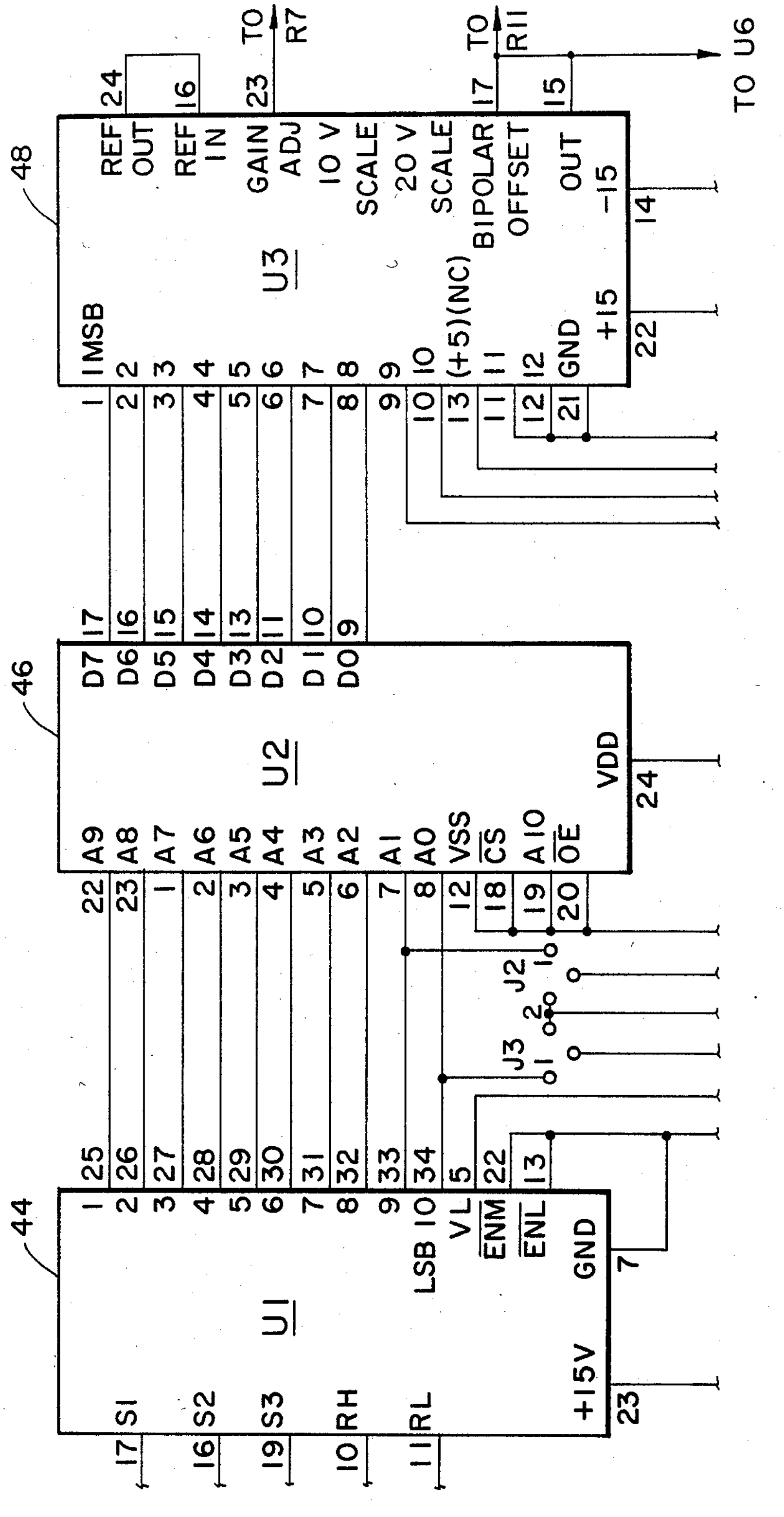
FIG. 4 is a detailed schematic diagram of a fragmentary portion of the circuit of FIG. 3 showing the pin number and terminal connections for the synchro-to-digital converter PROM U1, and digital-to-analog converter DIP's U2 and U3.
Figure 4A:
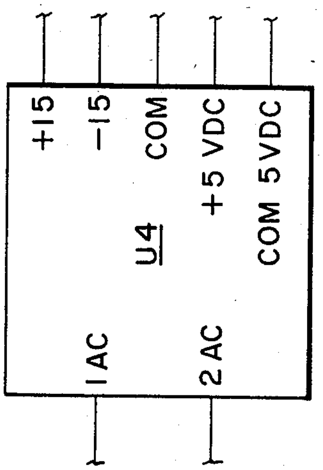
FIG. 4A is a detailed block diagram of the power supply block U4 of FIG. 3.

A detailed schematic diagram of a portion of FIG. 3 including DIP IC chips U1, U2, and U3 is illustrated in FIG. 4. This detailed schematic diagram shows the pin number couplings for the respective DIP's at both the inputs and outputs and with standard terminal legends. The power supply for the circuit of FIG. 3 including the IC chips down in detail in FIG. 4 is provided through block U4 shown in detail in FIG. 4A with standard legends.

The synchro-to-digital converter U1 generates the 10 bit digital word address from the synchronous generator stator and rotor signals S1, S2, S3, R1 (RH) and R2 (RL) which constitute shaft angle analog signals indicating the shaft angle of the tap changing transformer. The 10 bit digital word address corresponding to the shaft angle is applied to the address input lines A0 thru A9 of the PROM U2. The PROM U2 is previously encoded as hereafter described with the transfer function of the particular tap changing transformer so that tap number or tap position digital words are stored at the shaft angle digital word address locations. Thus, a non-linear relationship between shaft angle and tap number for a particular tap changing transformer is easily accommodated and compensated so that and eight bit tap number digital word appears at the output lines D0 thru D7 of PROM U2 accurately designating and indicating the secondary tap number selected at the tap changing transformer by the shaft angle. The tap number digital word is applied to the digital-to-analog converter U3 to provide at the output an analog current signal representing the tap number or tap position. The digital-to-analog converter U3 is coupled to provide an analog current signal output over the range of −1 mA to +1 mA for shaft angles of −180° to +180° on either side of the home position of the tap changing transformer shaft. If the home position is taken as 180° the output is coupled to provide an analog current signal over the range of −1 mA to +1 mA at output terminal strip 65 for transformer shaft angles from 0° to 360°.

However, the analog output signal from digital-to-analog converter U3 accurately represents the secondary tap number or tap position of the tap changing transformer even if a non-linear relationship obtains between the shaft angle and tap number for the transformer. This is accomplished by the encoding as hereafter described of PROM or E1ROM U2 with the transfer function or functional relationship of shaft angle to secondary tap position for the particular transformer. The tap number analog signals of the PAT output may also be used directly for operating a meter or other indicator of actual tap position.

The analog output current signal from U3 is applied through an output current buffer circuit 70 for providing and maintaining a constant current source at the PAT output terminal 65 which provides the analog tap number or tap position signals to the SCADA System. The output buffer circuit 70 provides a low impedance constant current source capable of stable operation over a wide range of output resistances. A feature and advantage of the buffer output circuit 70 is that the final analog tap number current signals can be transmitted or delivered over a considerable distance, for example, up to a quarter of a mile (0.4 km) while still maintaining the constant current level over the range of, for example, −1 mA to +1 mA indicative of the tap number or tap position of the secondary tap of the transformer being monitored by the PAT.

The gain for the selected range of the tap number analog output signal may be varied at variable resistor R5 while the offset of the selected range for the analog tap number output signal may be varied by variable resistor R9. Thus, the range of the output analog current from −1 mA to +1 mA may be offset from 0 to 2 mA or increased in range. Furthermore, a voltage analog output signal over a desired range may be used instead of an analog current signal, for example, over a range of 0 to +5 volts or 0 to +10 volts.

The output buffer circuit portion 70 includes an operational amplifier U6 followed by an instrumental amplifier U5 which delivers the stabilized analog tap number current signal through resistor R3. Operational amplifier U6 may be, for example, an 08 6J op amp while instrumental amplifier U5 may be an LM363 H-10 device and the respective pin numbers and couplings are shown in the circuit diagram of FIG. 3. Exemplary values for the associated amplifier and filter components of the current buffer output and for the gain and offset adjustment circuitry are set forth in Table I.

TABLE I

| | |
|---|---|
| C7 | .01 μf |

TABLE I-continued

| | |
|---|---|
| D1, D2 | 1N4740A |
| R10, R11 | 180KΩ |
| R6, R7, R8 | 270KΩ |
| R5, R9 | 50KΩ PRECISION TRIM POT |
| VR5 | V18Z83 VARISTOR |
| C1, C2 | 22 μf |
| C3, C4 | 220 f |
| C5, C6 | .1 μf |
| D3, D4 | 1N4742 |
| L1 | 10 mH @ 80 mA |
| R1, R2, R12 | 10KΩ 1% |
| R3 | 1KΩ 1% |
| R4 | 100Ω 1 watt |

Figure 5A:
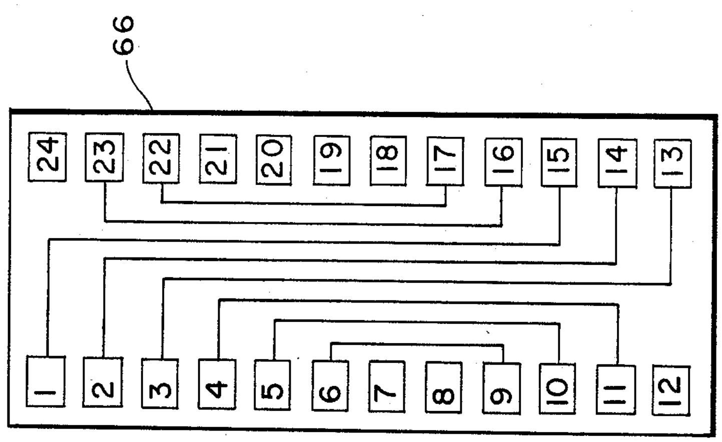
FIG. 5A is a diagrammatic view of a jumper option across the terminals of the PROM for tap changing transformers having a linear transfer function of the type illustrated in FIG. 5.
Figure 5:
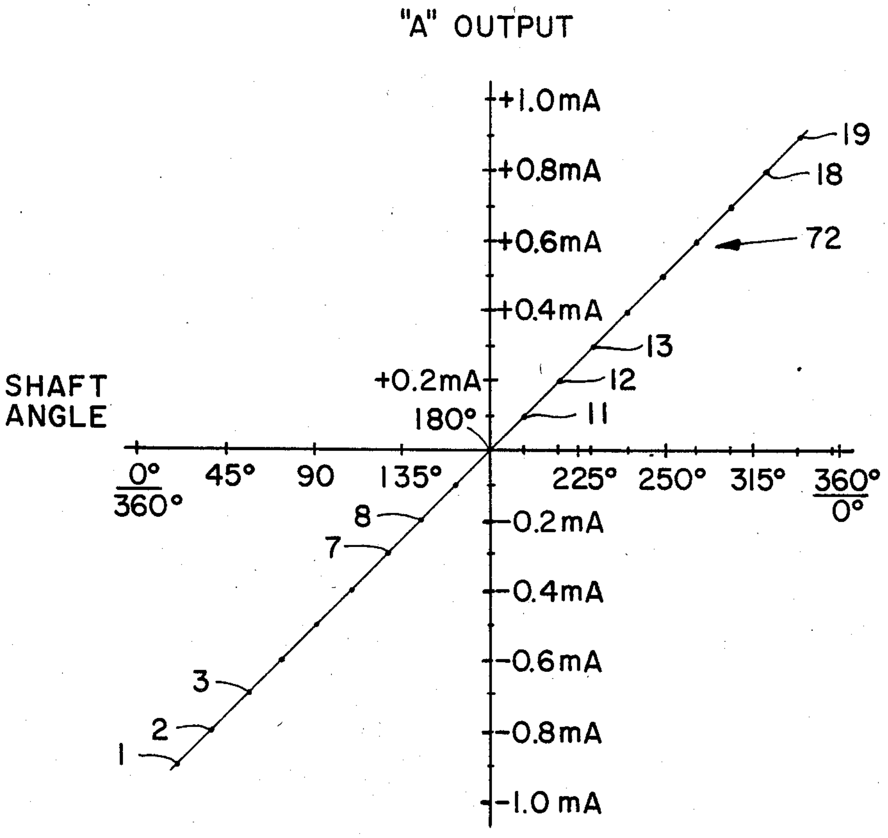
FIG. 5 is rectangular coordinate graph of a linear transfer function for a tap changing transformer having a linear functional relationship of shaft angle to tap number.

The procedure for encoding the PROM 46, also designated U2, is described with reference to FIGS. 5 and 6. If the shaft angle and secondary tap number or position are directly proportional for a particular tap changing transformer, the transfer function is a constant and the shaft angle and secondary tap position bear to each other a linear relationship. Such a linear transfer function tap changing transformer is represented by the graph of FIG. 5. FIG. 5 shows a graphical comparison of the PAT output over its variable range from −1 mA to +1 mA versus the shaft angle of the transformer from 0° to 360°. The home position is selected at 180° with variation on either side of ±180°.

The secondary tap positions or tap numbers 1 thru 19 are represented by dots on the transfer function line 72. In this example the dots representing the different tap numbers are equally spaced along the linear transfer function line and an increase or decrease in the shaft angle about the home position produces a proportionate increase or decrease in the secondary tap position. For such a linear tap changing transformer, a dial face and dial driven by the synchronous motor 55 coupled to the transformer as shown in FIG. 1A may be calibrated to provide an accurate and direct readout of secondary tap number or tap position. For such a linear tap changing transformer the encoding or programming of PROM 46 is simplified and a jumper 66 wired in accordance with the diagram of FIG. 5A may be plugged into the PROM socket to provide a constant transfer function and direct feed through of a tap number digital word from the shaft angle digital word address generated by the synchro-to-digital converter 44.

Figure 6:
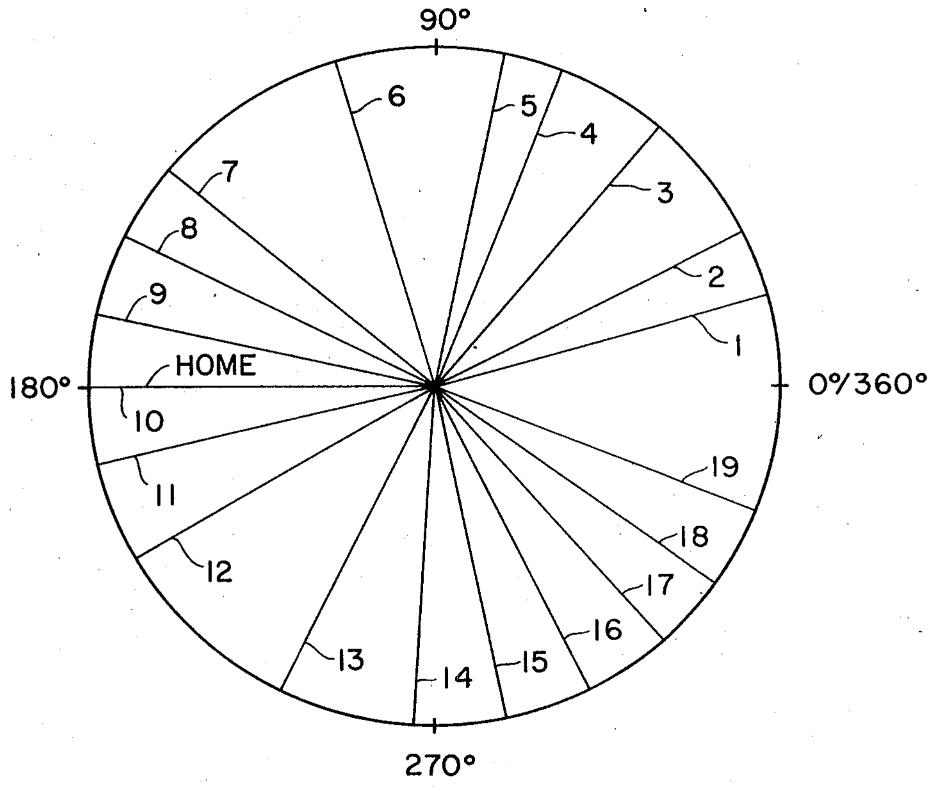
FIG. 6 is a radial or cylindrical coordinate graph of shaft angle to tap number for a variable tap transformer having as non-linear relationship of shaft angle to tap number and which also may be viewed as a diagrammatic representation of a shaft dial for the non-linear tap changing transformer.
Figure 6A:
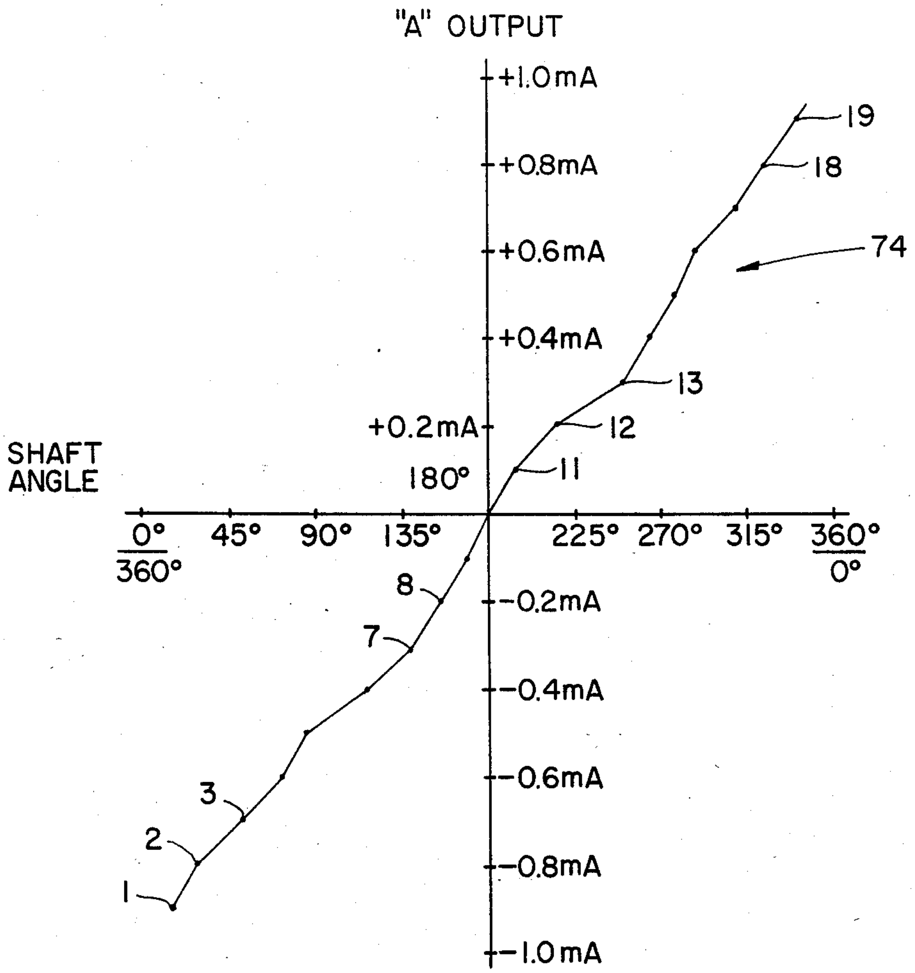
FIG. 6A is a rectangular coordinate graph showing the non-linear relationship of shaft angle to tap number for the tap changing transformer of FIG. 6.

The more generalized example of a tap changing transformer having a non-linear functional relationship of shaft angle to tap number is illustrated in FIGS. 6 and 6A. A radial dial or graphic representation of the non-linear relationship of tap number to shaft angle is shown in the diagram of FIG. 6. The perimeter of the circle or compass rose represents the true shaft angle of the tap changing transformer from 0° to 360° on either side of the home position at 180°. The radial lines represent the disproportionate positions at which the successive secondary taps are encountered graphically presenting the non-proportional and non-linear relationship of tap number to shaft angle. While the non-linear relationship appears dramatic, it is typical of many tap changing transformer models. It is apparent that a dial driven by synchro motor 55 operatively coupled to follow the shaft of such a transformer could be used only for indicating shaft angle as the tap number could not be correlated with the shaft angle without indepth knowledge of the transfer function for the particular transformer.

The transfer function or functional relationship of shaft angle to tap number is obtained by empirical determination and plotting, for example, as shown in FIG. 6A. FIG. 6A affords a rectangular coordinate graphical representation of the non-linear transfer function of the tap changing transformer represented by FIG. 6. It is this transfer function which is encoded in the PROM U2 or 46 for custom adapting and programming the position angle transducer for the transformer represented by FIG. 6.

The shaft angle digital word addresses generated by the synchro-to-digital converter 44 in effect represent the horizontal axis of the graph of FIG. 6A. The tap number digital data stored at the respective shaft angle digital word address locations are taken from the values of the transfer function line 74 in the graph of FIG. 6A. In the graph of FIG. 6A these tap number or tap position values are of course represented by the value of the final tap number analog signal appearing at the PAT output. In the transfer function memory of PROM 46, however, these are represented by tap number digital words subsequently converted to the tap number analog signals by digital-to-analog converter 48.

A feature and advantage of the programmable or encodable position angle transducer of the present invention is that the original transfer function of a particular tap changing transformer may be converted or transformed to any other desired transfer function according to the algorithms selected for encoding in PROM 46. Typically, the PAT would be used for converting a non-linear transfer function to a linear transfer function at the output so that the final output analog signals accurately encode and represent the operating secondary tap number or tap position selected by rotating the transformer shaft. However the flexibility of the invention in effect provides a flexible transfer function position angle transducer which permits, for example, compressing the tap position data for display over a smaller arc than the actual arc of the transformer shaft by changing the gain or slope of the transfer function. Similarly, the home position of the tap number data display may be changed relative to the home position of the transformer shaft or a "deadband" may be inserted on either side of the home position, for example, a deadband of ±10° on either side of the home position.

Figure 7:
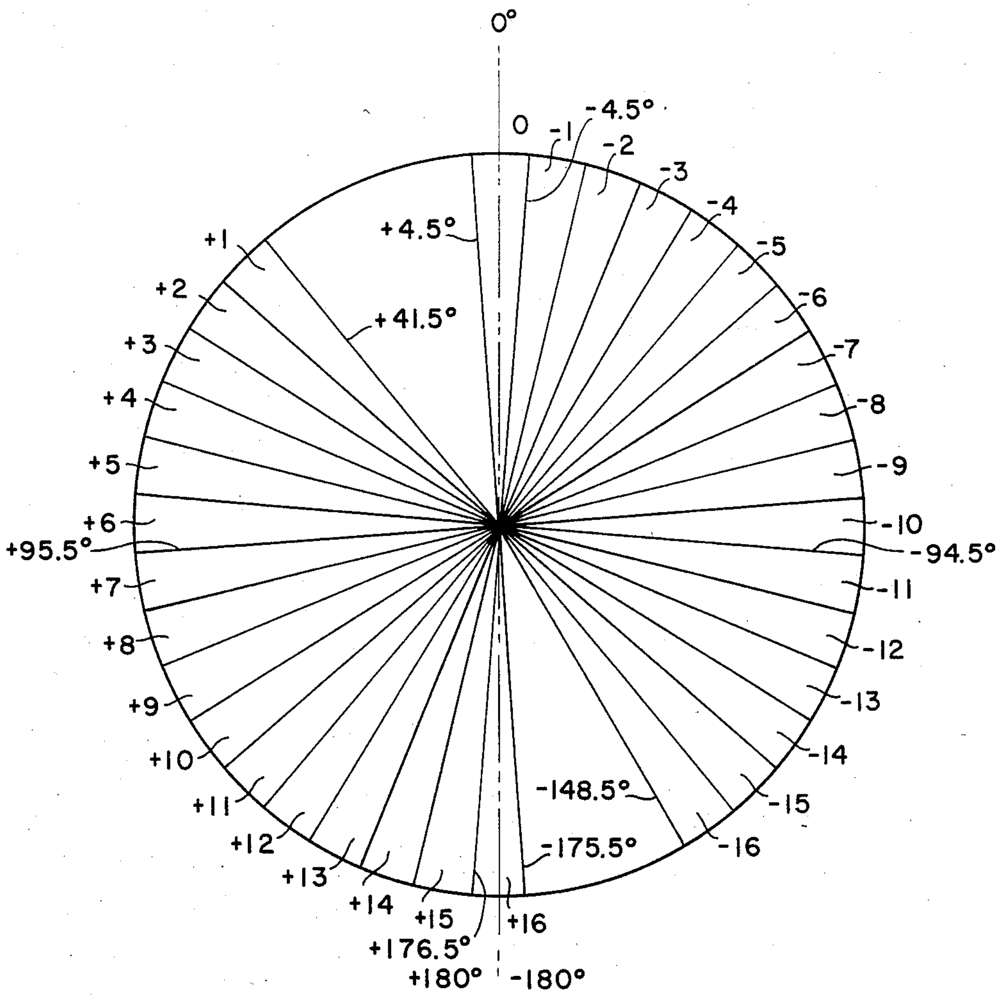
FIG. 7 is a radial or cylindrical coordinate graph of shaft angle to tap number for a variable tap transformer having dead spaces with no taps over two sectors of the shaft angle circle and which also may be viewed as a diagrammatic representation of a shaft dial with the two dead spaces as shown.
Figure 7A:
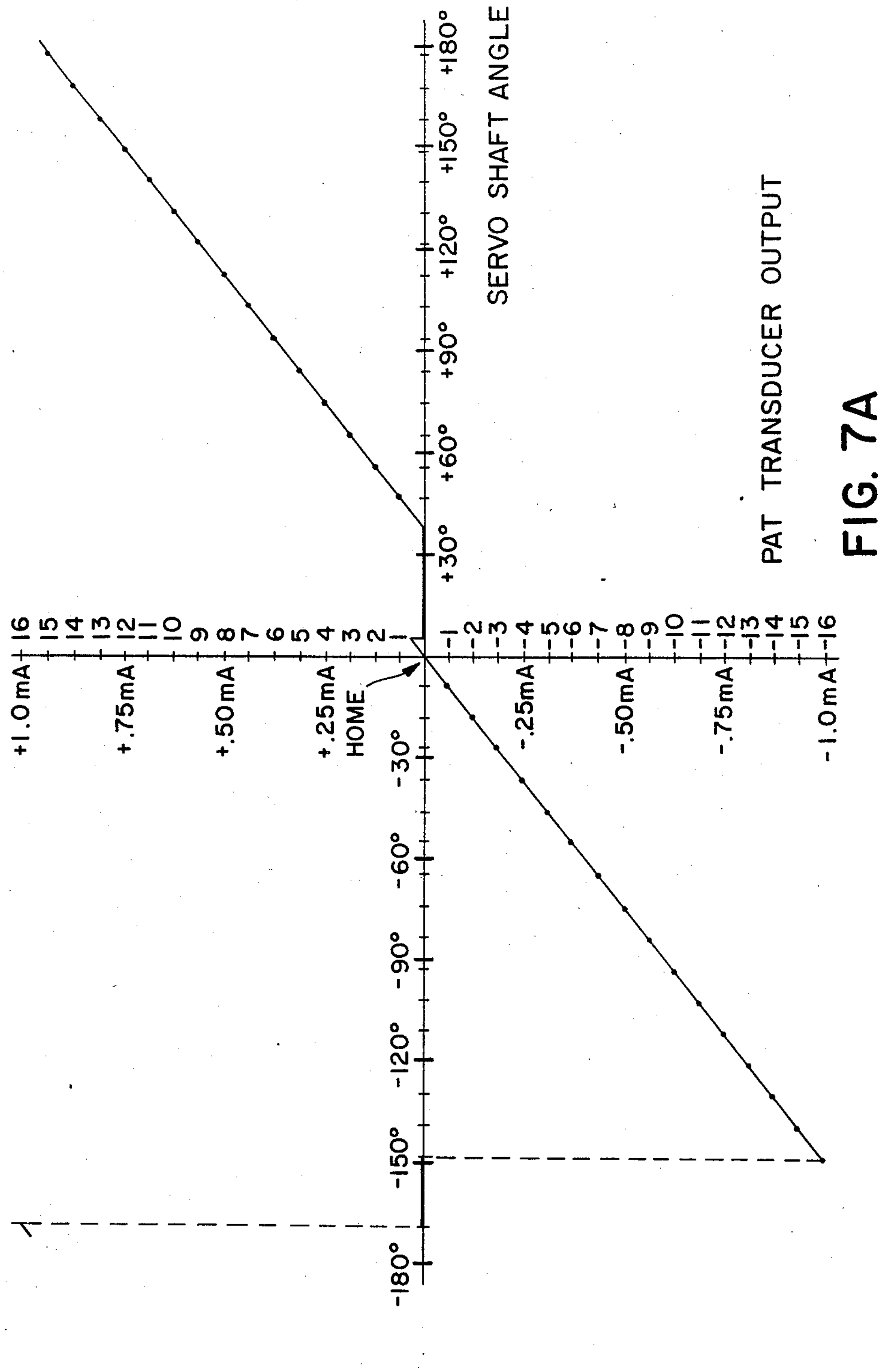
FIG. 7A is a rectangular coordinate graph showing the relationship of shaft angle to tap number for the tap changing transformer of FIG. 7.

Another tap changing transformer having a non-linear functional relationship of shaft angle to tap number is illustrated in FIGS. 7 and 7A. The cylindrical coordinate graph of the transfer function shown in FIG. 7 also provides a diagrammatic representation of the radial dial of the tap changing transformer shaft. In this example, the shaft compass rose or circle is characterized by two sectors with no secondary taps or tap numbers which may be characterized as dead spans, dead spaces or dead bands. The upper dead span sector of 36° occurs between the 0 tap number position and the +1 tap number position. The lower dead span sector of 27° occurs between the +16 tap number and the −16 tap number. Otherwise, the tap changing transformer is characterized by a generally linear relationship between shaft angle and tap number for tap positions +1 to +16 and tap positions 0 to −16. Each tap number occupies a uniform shaft angle tap span of 9° with a smooth transition through the successive 9° tap spans.

This functional relationship is further shown in the rectangular coordinate graph of FIG. 7A in which the tap number analog current signal from −1.0 mA to +1.0 mA is shown on the vertical axis verses the shaft angle from −180° to +180° along the horizontal axis. The dead spans or dead spaces are graphically depicted by the horizontal breaks or lines in the otherwise smooth and linear transfer function.

Figure 8:
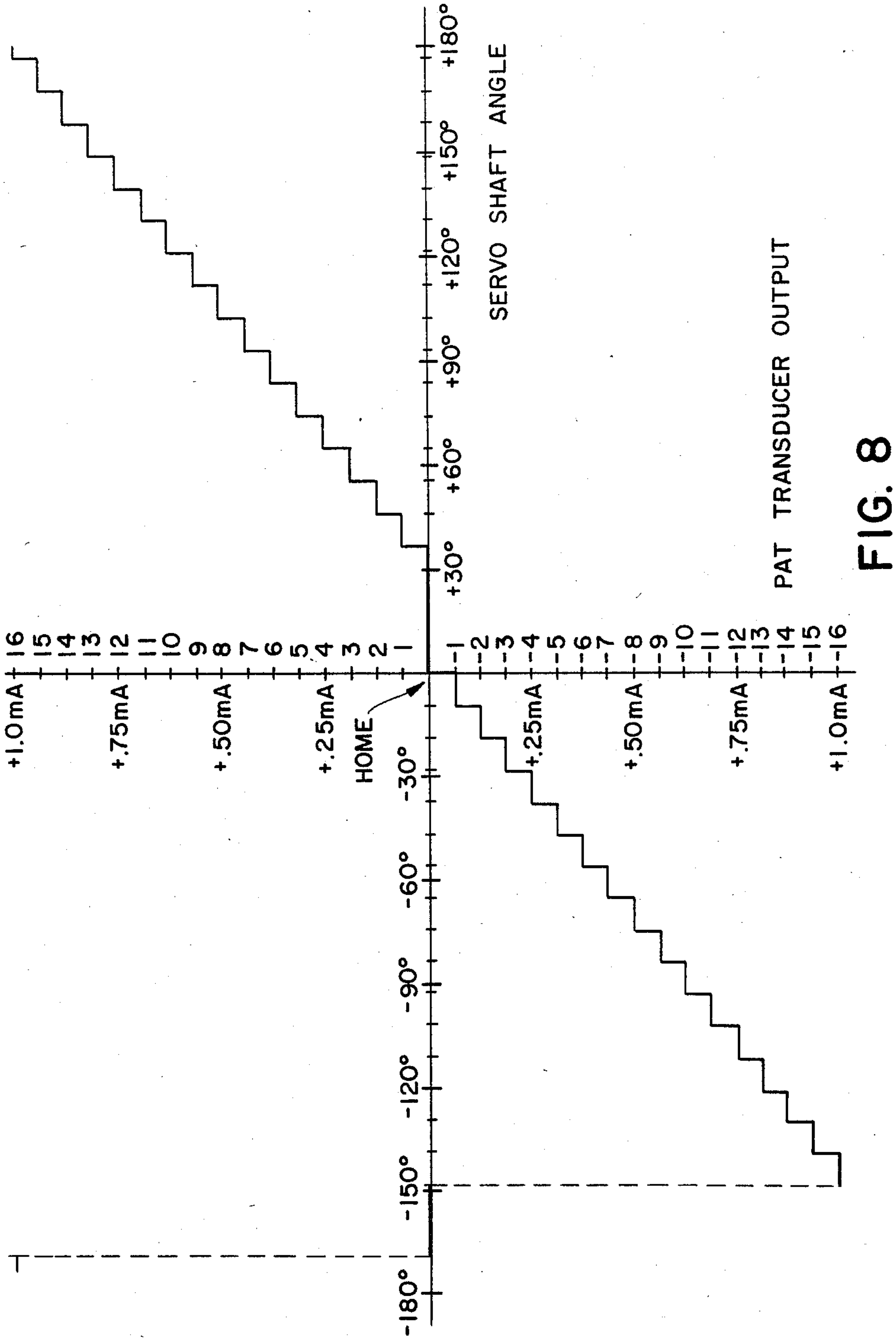
FIG. 8 is a rectangular coordinate graph showing the non-linear step function relationship of shaft angle to tap number for a tap changing transformer similar to one having the characteristics shown in FIG. 7 but with a step function transition between tap numbers rather than a smooth transition between tap numbers.

A variation of the piecewise smooth transfer functional relationship of FIG. 7A is shown in the step transfer functional relationship in the rectangular coordinate graph of FIG. 8. FIG. 8 depicts the transfer function relationship for a tap changing transformer similar to that shown in FIG. 7 but with a stepwise functional relationship of tap number to shaft angle. Rather than a smooth transition between tap numbers as the shaft angle traverses the successive 9° tap spans, the transition between successive tap numbers is an abrupt or discontinuous step function from one 9° tap span to the next. Actually, each tap number occupies a range of 9° on the dial and a corresponding range of angles on the transformer shaft.

In each instance the shaft transfer function requirements of a particular transformer are first ascertained empirically and graphically in the manner described with reference to FIGS. 5–8. This transfer function data is organized in the format of the data files or DAT file lists presented, for example, in Tables III and V. From the data files, hexadecimal files of the type, for example, presented in Tables IV and VI are generated. The PROM or EPROM such as a 2716 programmable read-only memory is then encoded with the hexadecimal file according to the manufacturer's procedures and specifications thereby correlating the digital word addresses and address locations with shaft angle, and correlating the contents of the shaft angle address locations with the corresponding tap number or tap location. An algorithm facilitates encoding and deriving the hexadecimal file contents of the PROM or EPROM from the transfer function data files or DAT files.

The algorithm generates a hexadecimal file for the EPROM from the transfer function data file in turn manually compiled from the dial face and rectangular coordinate graph, for example, of FIGS. 7 and 7A. A documented Pascal/Z (trademark) program listing of the algorithm according to the present invention for generating an EPROM hexadecimal file is set forth in the following Table II. This is followed in Table III by the data file or DAT file list manually compiled from the graph of FIG. 7A. The algorithm operates on the data list of Table III to generate the exemplary hexadecimal file listing of Table IV. Table IV represents the tap changing transformer having the dial face and transfer functional relationship illustrated in FIGS. 7 and 7A with smooth slopes in the transitions between successive tap numbers. Table V is the manually compiled data file and Table VI the hexadecimal code generated by the algorithm for the tap changing transformer transfer function of FIG. 8 characterized by step function transitions between successive tap positions or tap numbers.

The hexadecimal files of Tables IV and VI are generated by the program of Table II from the respective data files of Tables III and V in turn compiled from the graphs for the particular tap changing transformers illustrated with reference to FIGS. 7A–8. The hexadecimal files shown in the examples of Tables IV and VI in the Intel hex file format are then placed in the EPROM using the manufacturers EPROM Programmer. The code number appearing under the table heading of Tables III & IV is the code number for the tap changing transformer of FIG. 7A, while the code number under the table heading of Tables V and VI is the code number for the tap changing transformer of FIG. 8.

While the invention has been described with reference to particular example embodiments, it is intended to cover all variations and equivalents within the scope of the following claims.

TABLE II

```
{ PATZ is a program to compute the rom code for a PAT
transducer given the angles of the taps on a transformer tap
changer. The angles are to be entered as 'discontinuities'
in the transfer function. Alex M. D'Anci 1/31/84, 2/28/84
Modified to accept a file of reals in ASCII format
directly from a disk file. AMD 3/4/84
Modified to run under Pascal/Z* 3/5/84
Modified to accept file name from command line assuming
extension .DAT and writes a file with extension .HEX AMD
3/6/84
Commented for patent application 3/18/84
* is a trademark of Ithaca Intersystems Inc.
}
PROGRAM PATZ;
CONST
MAX_ROM = 1023; { 10 bit address space }
ang = 0; opt = 1; { TABLE indices }
TYPE
BYTE = 0..255; { Single byte type }
NIBBLE = 0..15; { Single nibble type }
ISTRING = ARRAY[0..3] OF CHAR; { Integer hex string }
BSTRING = ARRAY[0..1] OF CHAR; { Byte hex string }
VAR { Global variable declarations }
TABLE : ARRAY[ 0..1, 0..63 ] OF REAL;
{ Input Table of tap versus output data }
ROM : ARRAY[ 0..MAX_ROM ] OF BYTE;
{ Array of data to be put in EPROM or ROM }
outfile : STRING 15; { Primary name of file to be
processed }
FUNCTION nib$( b : nibble ) : CHAR;
{ Nib$ accepts an integer in subrange nibble and returns a
character representing the hex value of the integer.
}
BEGIN
IF b < 10 THEN nib$ := CHR( b + 48 ) ELSE nib$ := CHR( b +
55 );
END; { of nib$ }
PROCEDURE int_to_str( i : INTEGER ; VAR hex$ : istring );
{ Int_to_str accepts an integer and a pointer to a string
variable of length 4 (hex$). The integer is converted to
its hexidecimal equivalent, and placed in the string
variable.
}
VAR bhi, blo : INTEGER;
nhihi, nhilo, nlohi, nlolo : nibble;
BEGIN
bhi := i DIV 256;
blo := i - bhi * 256;
nhihi := bhi DIV 16;
nhilo := bhi - nhihi * 16;
nlohi := blo DIV 16;
nlolo := blo - nlohi * 16;
hex$[ 0 ] := nib$( nhihi );
hex$[ 1 ] := nib$( nhilo );
hex$[ 2 ] := nib$( nlohi );
hex$[ 3 ] := nib$( nlolo );
END; { of int_to_str }
PROCEDURE byte_to_str( b : byte ; VAR byte$ : bstring );
{ Byte_to_str is similar to int_to_str except it accepts an
integer of subrange byte and deposits the hexidecimal
representation in the string variable byte$.
}
VAR nhi, nlo : nibble;
BEGIN
nhi := b DIV 16;
nlo := b - nhi * 16;
byte$[0] := nib$( nhi );
byte$[1] := nib$( nlo );
END; { of byte_to_str }
PROCEDURE get_table;
{ Get_Table reads the CP/M command tail and concatenates a
.DAT to the file name. If no file name is in the command
tail, then the program waits for a file name from the
keyboard, although no prompt 1s given.
}
VAR
rfile : TEXT; { File of type text }
```

TABLE II-continued

```
filename : STRING 15; { Composite operating system file
name }
ix : INTEGER; { index for TABLE }
BEGIN { get__table }
ix := 0; { Reset Table index. }
READLN( filename ); { Get command tail. }
outfile := filename; { Save primary name for output. }
APPEND( filename, '.DAT' ); { Concatenate secondary generic
name .DAT. }
ORITELN( 'Reading file ', filename ); { Screen comment for
operator. }
RESET( filename, rfile ); { Open file for sequential read. }
WHILE NOT EOF( rfile ) DO { Process input. }
BEGIN
READLN( rfile, table[ ang,ix ] ); { Get angle data and
store in array. }
READLN( rfile, table[ opt,ix ] ); { Get output data and
store in array. }
ix := ix + 1 { Increment Table index. }
END; { WHILE NOT EOF }
END; { of get__Table }
PROCEDURE gen data;
{ Gen__data takes TABLE produced by get Table and converts it
to the data to be placed in the EPROM. The procedure reads
the array sequentially and calculates the ROM data in a
single pass. Both step and linear transfer functions can be
created with this procedure. This procedure outputs ROM.
}
VAR
address, { array index for ROM }
tap__address, { current tap in R old__tap, { previous
tap in ROM index form }
pointr, { index into TABLE }
tstep, { tiny step used for linear step }
datai, { integer data type }
iz : INTEGER; { tiny step counter }
datax : BYTE; { data in ROM }
adiff, { angle difference between taps for a linear step}
odiff, { output difference between taps for a linear
step}
dstep, { number of tiny steps in a linear step }
rstep : REAL; { real tstep counter }
BEGIN { gen__data }
WRITELN('Generating EPRN('Generating EPROM data matrix');
{ Screen comment for operator }
old__tap := 0; { Reset tap. }
pointr := 0; { Reset TABLE index. }
REPEAT
tap__address := 512 + ROUND ( 2.8444444 * table[
ang,pointr+1 ]);
{ Calculate equivelent ROM address of current tap. }
IF table[ opt,pointr ] > 1.0 THEN { Test for linear
step. > 1 = linear }
BEGIN { linear step }
adiff := table[ang,pointr+1] - table[ang,pointr];
{ Calculate angle difference. }
odiff := table[opt,pointr+1] -
table[opt,pointr-1];
{ Calculate output difference. }
dstep := ( 2.8444444 * adiff ) / ( ( odiff/2 ) *
256.0 );
{ Calculate real tiny step. }
rstep := dstep;
{ Create tiny step accumulator. }
tstep := ROUND( rstep );
{ Create integer tiny step. }
iz := 0; { Initialize tiny step counter. }
IF datax = 255 THEN datax := 254;
datax := datax + 1; { Initial data }
REPEAT { do linear step }
ROM[ address ] := datax; { store data }
iz := iz + 1; { Increment tiny step counter. }
IF iz = tstep THEN { Up to next tiny step? }
BEGIN { Calculate new data for next tiny step.}
IF datax = 255 THEN datax :=254;
datax := datax + 1;
rstep := rstep + dstep;
tstep := ROUND( rstep );
END;
address := address + 1; { Next ROM address. }
UNTIL address = tap__address; { At next address yet? }
address := address - 1;
END { of linear step }
ELSE { Do a discrete step between taps. }
BEGIN { discrete step }
datai := ROUND ( 128 * ( table[ opt, pointr ] + 1 ) );
{ Establish data for ROM. This step must be
done at the start of a linear step. }
IF datai > 255 THEN datax := 255 ELSE
datax := datai;
IF tap__address > MAX__ROM THEN tap__address :=
MAX__ROM;
{ Fix for ROM override. }
FOR address := old__tap TO tap__address DO
ROM[ address ] := datax { Fill step with data. }
END; { of discrete step }
old__tap := tap__address; { Updata old tap. }
pointr := pointr + 1; { Next TABLE data. }
UNTIL old__tap >= MAX__ROM; { End of ROM. }
END; { of gen__data. }
PROCEDURE intel hex;
{ Intel__hex takes the array ROM and converts it to a file on
disk in the Intel* ( Intellec* ) Hex format. The output
file has the same primary name as the input file. This
procedure appends the secondary name .HEX.
*Intel and Intellec are trademarks of Intel
Corporation
}
VAR
hex__file : TEXT; { file of type TEXT }
sum, { checksum accumulator }
li, { line index }
di, { data index }
loadh, { load checksum high byte }
loadl, { load checksum low byte }
load : INTEGER; { load address }
checksum : BYTE; { checksum }
load$ :ISTRING; { string version of load }
data$, { string version of data }
cksum$ : BSTRING; { string version of checksum }
BEGIN
APPEND( outfile, '.HEX' ); { Concatenate secondary name. }
REWRITE( outfile, hex__file ); { Create or write over output
file. }
WRITELN('Writing Intel Hex file: ',outfile );
{ Screen comment for operator. }
FOR li := 0 TO 63 DO { Create a file. }
BEGIN { Do a line. }
load := li * 16; { Calculate load address. }
int__to__str( load, load$ ); { Convert to string. }
loadh := load DIV 256; { hi byte of load checksum }
loadl := load-loadh * 256; { low byte of load
checksum }
sum := 16 + loadh + loadl; { Calculate checksum. }
WRITE( hex__file, ':10' );
{ Write header for line of 16 data bytes to disk. }
WRITE( hex__file, load$ ); { Write load address to
disk. }
WRITE( hex__file, '00' ); { Write data record type flag
( ASCII) to disk. }
FOR di := 0 TO 15 DO { Do a data byte. }
BEGIN
byte__to__str( ROM[ li * 16 + di ], data$ );
{ Find data in ROM and convert it to string. }
WRITE( hex__file; data$ ); { Write it to disk. }
sum := sum + ROM[ li*16+di ] { Update checksum. }
END; { of data output for this line. }
checksum := sum - sum DIV 256 * 256 ;
{ Calculate checksum }
IF checksum =0 THEN checksum := 0 ELSE { Special
case }
checksum := 256-checksum;
byte__to__str( checksum, data$ ); { Convert checksum to
string. }
WRITELN( hex__file; data$);
{ Write checksum string to disk and append a
carrage return and linefeed. }
END; { of outputting ROM array. }
WRITELN( hex__file; ':0000000000'); { Intel Hex EOF
marker }
END; { of intel__hex. }
{ Main program starts here. }
BEGIN
get__table; { Input tap data file. }
```

TABLE II-continued

```
gen__data; { Convert to ROM data. }
intel__hex; { Output ROM data to disk. }
END. { of patz }
```

TABLE III

| M-36RRR.DAT |
|---|
| −180 |
| 0.96875 |
| −180 |
| 2 |
| −175.5 |
| 1.0 |
| −175.5 |
| 0.0 |
| −145.5 |
| −1.0 |
| −145.5 |
| 2 |
| 4.5 |
| 0.03125 |
| 4.5 |
| 0.0 |
| 41.5 |
| 2 |
| 180 |
| 0.96875 |

TABLE IV

| M-36RRR.HEX |
|---|
| :10000000FCFDFDFDFEFEFEFFFFFFFFFFFF80808089 |
| :1000100080808080808080808080808080808080E0 |
| :1000200080808080808080808080808080808080D0 |
| :1000300080808080808080808080808080808080C0 |
| :1000400080808080808080808080808080808080B0 |
| :1000500080808080808080808080808080808080A0 |
| :10006000808000010101020202030303030404046F |
| :100070000505050606060707070708080809090910 |
| :100080000A0A0A0B0B0B0B0C0C0C0D0D0D0E0E0EB1 |
| :100090000F0F0F101010101111111212121313131351 |
| :1000A000141414141515151616161717171818F2 |
| :1000B000181919191A1A1A1B1B1B1C1C1C1C1D1D94 |
| :1000C0001D1E1E1E1F1F1F2020202121212122234 |
| :1000D0002223232324242425252525262626 2727D5 |
| :1000E000272828282929292A2A2A2B2B2B2C2C76 |
| :1000F0002C2D2D2D2E2E2E2E2F2F2F303030313116 |
| :1001000031323232323333333434343535353636B6 |
| :10011000363637373738383839393939A3A3A3B3B57 |
| :100120003B3B3C3C3C3D3D3D3E3E3E3F3F3F3F40F8 |
| :10013000404041414142424243434343444444599 |
| :100140004545464646474747484848484949494A39 |
| :100150004A4A4B4B4B4C4C4C4C4D4D4D4E4E4E4FDA |
| :100160004F4F505050505151515252525353535347B |
| :100170005454545555555656565757575858585 91C |
| :100180005959595A5A5A5B5B5B5C5C5C5D5D5D5DBD |
| :100190005E5E5E5F5F5F606060616161616262625E |
| :1001A000636363646464656565666666666767 67FE |
| :1001B0006868686969696A6A6A6A6B6B6B6C6C6C9F |
| :1001C0006D6D6D6E6E6E6E6F6F6F70707071717140 |
| :1001D00072727273737373747474757575767676E0 |
| :1001E0007777777777878787979797A7A7A7B7B7B81 |
| :1001F0007B7C7C7C7D7D7D7E7E7E7F7F7F7F808023 |
| :100200008081818182828283838384848480808 0D0 |
| :1002100080808080808080808080808080808080DE |
| :1002200080808080808080808080808080808080CE |
| :1002300080808080808080808080808080808080BE |
| :1002400080808080808080808080808080808080AE |
| :10025000808080808080808080808080808080809E |
| :10026000808080808080808080808080808080808E |
| :100270008080808080808080818181828282838 3836C |
| :100280008384848485858586868687878788888811 |
| :1002900089898989 8A8A8A8B8B8B8C8C8C8D8D8DB0 |
| :1002A0008E8E8E8F8F8F8F9090909191919292924F |
| :1002B000939393949494949595959696969797 97EF |
| :1002C000989898999999999A9A9A9A9B9B9B9C9C9C8E |
| :1002D0009D9D9D9E9E9E9F9F9FA0A0A0A0A1A1A12D |
| :1002E000A2A2A2A3A3A3A4A4A4A5A5A5A5A6A6A6CD |
| :1002F000A7A7A7A8A8A8A9A9A9AAAAAAABABABAB6C |

TABLE IV-continued

| M-36RRR.HEX |
|---|
| :10030000ACACACADADADAEAEAEAFAFAFB0B0B0B10A |
| :10031000B1B1B1B2B2B2B3B3B3B4B4B4B5B5B5B6AA |
| :10032000B6B6B6B7B7B7B8B8B8B9B9B9BABABABB4A |
| :10033000BBBBBCBCBCBCBDBDBDBEBEBEBFBFBFC0E9 |
| :10034000C0C0C1C1C1C1C2C2C2C3C3C3C4C4C4C589 |
| :10035000C5C5C6C6C6C7C7C7C7C8C8C8C9C9C9CA28 |
| :10036000CACACBCBCBCCCCCCCCDCDCDCDCECECECFC7 |
| :10037000CFCFD0D0D0D1D1D1D2D2D2D2D3D3D3D467 |
| :10038000D4D4D5D5D5D6D6D6D7D7D7D8D8D8D8D906 |
| :10039000D9D9DADADADBDBDBDCDCDCDDDDDDDDEDEA-<br>5 |
| :1003A000DEDEDFDFDFE0E0E0E1E1E1E2E2E2E3E345 |
| :1003B000E3E3E4E4E4E5E5E5E6E6E6E7E7E7E8E8E5 |
| :1003C000E8E9E9E9E9EAEAEAEBEBEBECECECEDED84 |
| :1003D000EDEEEEEEEEFEFEFEFF0F0F0F1F1F1F2F223 |
| :1003E000F2F3F3F3F4F4F4F4F5F5F5F6F6F6F7F7C3 |
| :1003F000F7F8F8F8F9F9F9FAFAFAFAFBFBFBFCFC62 |
| :0000000000 |

TABLE V

| M-36.DAT |
|---|
| −180 |
| 1.0 |
| −175.5 |
| 0.0 |
| −145.5 |
| −1.0 |
| −139.5 |
| −0.9375 |
| −130.5 |
| −0.875 |
| −121.5 |
| −0.8125 |
| −112.5 |
| −0.75 |
| −103.5 |
| −0.6875 |
| −94.5 |
| −0.625 |
| −85.3 |
| −0.5625 |
| −76.5 |
| −0.5 |
| −67.5 |
| −0.4375 |
| −58.5 |
| −0.375 |
| −49.5 |
| −0.3125 |
| −40.5 |
| −0.25 |
| −31.5 |
| −0.1875 |
| −22.5 |
| −0.125 |
| −13.5 |
| −0.0625 |
| −4.5 |
| 0.0 |
| 41.5 |
| 0.0625 |
| 50.5 |
| 0.125 |
| 59.5 |
| 0.1875 |
| 68.5 |
| 0.25 |
| 77.5 |
| 0.3125 |
| 86.5 |
| 0.375 |
| 95.5 |
| 0.4375 |
| 104.5 |
| 0.5 |
| 113.5 |
| 0.5625 |
| 122.5 |

TABLE V-continued

| M-36.DAT |
| --- |
| 0.625 |
| 131.5 |
| 0.6875 |
| 140.5 |
| 0.75 |
| 149.5 |
| 0.8125 |
| 158.5 |
| 0.875 |
| 167.5 |
| 0.9375 |
| 176.5 |
| 1.0 |
| 180 |
| 1.0 |

TABLE VI

| M-36.HEX |
| --- |
| :10000000FFFFFFFFFFFFFFFFFFFFFFFFFF8080807D |
| :1000100080808080808080808080808080808080E0 |
| :1000200080808080808080808080808080808080D0 |
| :1000300080808080808080808080808080808080C0 |
| :1000400080808080808080808080808080808080B0 |
| :1000500080808080808080808080808080808080A0 |
| :10006000808000000000000000000000000000000090 |
| :1000700000000000000080808080808080808080818 |
| :100080008080808080808080808080808010101 0D8 |
| :1000900010101010101010101010101010101010 60 |
| :1000A00010101010101018181818181818181818 00 |
| :1000B00018181818181818181818181818181818C0 |
| :1000C0002020202020202020202020202020202030 |
| :1000D00020202020202020202020282828282828F0 |
| :1000E0002828282828282828282828282828282890 |
| :1000F0002828283030303030303030303030303018 |
| :10010000303030303030303030303030303838 38D7 |
| :10011000383838383838383838383838383838385F |
| :100120003838383838384040404040404040404 0FF |
| :1001300040404040404040404040404040404040BF |
| :10014000484848484848484848484848484848482F |
| :1001500048484848484848484848505050505050EF |
| :10016000505050505050505050505050505050508F |
| :1001700050505058585858585858585858585858 17 |
| :1001800058585858585858585858585858606060D7 |
| :10019000606060606060606060606060606060605F |
| :1001A000606060606060686868686868686868 68FF |
| :1001B00068686868686868686868686868686868BF |
| :1001C00070707070707070707070707070707070 2F |
| :1001D00070707070707070707070787878787878EF |
| :1001E000787878787878787878787878787878788F |
| :1001F00078787880808080808080808080808080 17 |
| :1002000080808080808080808080808080808080EE |
| :1002100080808080808080808080808080808080DE |
| :1002200080808080808080808080808080808080CE |
| :1002300080808080808080808080808080808080BE |
| :1002400080808080808080808080808080808080AE |
| :10025000808080808080808080808080808080809E |
| :10026000808080808080808080808080808080808E |
| :10027000808080808080888888888888888888882E |
| :1002800088888888888888888888888888888888EE |
| :10029000909090909090909090909090909090905E |
| :1002A000909090909090909090989898989898 9816 |
| :1002B00098989898989898989898989898989898BE |
| :1002C000989898A0A0A0A0A0A0A0A0A0A0A0A0A046 |
| :1002D000A0A0A0A0A0A0A0A0A0A0A0A0A8A8A8A8FE |
| :1002E000A8A8A8A8A8A8A8A8A8A8A8A8A8A8A8A88E |
| :1002F000A8A8A8A8A8B0B0B0B0B0B0B0B0B0B0B02E |
| :10030000B0B0B0B0B0B0B0B0B0B0B0B0B0B0B0B0ED |
| :10031000B8B8B8B8B8B8B8B8B8B8B8B8B8B8B8B85D |
| :10032000B8B8B8B8B8B8B8B8B8C0C0C0C0C0C0C015 |
| :10033000C0C0C0C0C0C0C0C0C0C0C0C0C0C0C0C0BD |
| :10034000C0C0C0C8C8C8C8C8C8C8C8C8C8C8C8C845 |
| :10035000C8C8C8C8C8C8C8C8C8C8C8C8D0D0D0D0FD |
| :10036000D0D0D0D0D0D0D0D0D0D0D0D0D0D0D0D08D |
| :10037000D0D0D0D0D0D0D8D8D8D8D8D8D8D8D8D82D |
| :10038000D8D8D8D8D8D8D8D8D8D8D8D8D8D8D8D8ED |
| :10039000E0E0E0E0E0E0E0E0E0E0E0E0E0E0E0E05D |
| :1003A000E0E0E0E0E0E0E0E0E0E8E8E8E8E8E8E815 |
| :1003B000E8E8E8E8E8E8E8E8E8E8E8E8E8E8E8E8BD |

TABLE VI-continued

| M-36.HEX |
| --- |
| :1003C000E8E8E8F0F0F0F0F0F0F0F0F0F0F0F0F045 |
| :1003D000F0F0F0F0F0F0F0F0F0F0F0F0F8F8F8F8FD |
| :1003E000F8F8F8F8F8F8F8F8F8F8F8F8F8F8F8F88D |
| :1003F000F8F8F8F8F8F8FFFFFFFFFFFFFFFFFFFF37 |
| :000000000 |

I claim:

1. An improved position angle transducer for voltage compensating tap changing transformers which have a rotatable shaft for changing the secondary tap of the transformer to different secondary tap positions or tap numbers by rotation of the shaft, a shaft motor for rotating the shaft through different tap changing shaft angles, a shaft angle sensor operatively coupled for generating shaft angle analog signals corresponding to the tap changing shaft angles, wherein each transformer is characterized by a transfer function or functional relationship of tap changing shaft angle to tap number, the improvement comprising:

analog-to-digital converter means having a plurality of inputs operatively coupled to receive the shaft angle analog signals from the shaft angle sensor and a plurality of outputs for delivering digital words, said analog to digital converter means being programmed to deliver shaft angle digital words at the outputs corresponding to the shaft angle analog signals and tap changing shaft angles of the shaft of a tap changing transformer;

computer program means operatively programmed for automatically converting empirically determined transfer function data correlating shaft angle and tap number for a particular tap changing transformer to a digitally encoded table correlating shaft angle and tap number digital words for said tap changing transformer;

digital-to-digital converter means having a plurality of inputs coupled to receive the shaft angle digital words and a plurality of outputs for delivering tap number digital words, said digital-to-digital converter means being operatively programmed with said digitally encoded table for the tap changing transformer for converting the shaft angle digital words to tap number digital words according to the transfer function or functional relationship of tap changing shaft angle to tap number for the particular tap changing transformer.

2. The position angle transducer of claim 1 further comprising:

digital-to-analog converter means having a plurality of inputs operatively coupled for receiving the tap number digital words and an output for delivering tap number analog signals representing the tap number digital words and tap numbers corresponding to the tap changing shaft angle of the particular tap changing transformer.

3. The improved position angle transducer of claim 1 wherein said shaft angle sensor comprises a synchronous generator having rotor and stator coils for generating rotor and stator synchro signals corresponding to the tap changing shaft angle, and wherein the shaft angle analog signals comprise said synchro signals;

said analog-to-digital converter means comprising a synchro-to-digital converter having inputs operatively coupled to receive the synchro signals from the synchronous generator.

4. The improved position angle transducer of claim 1 wherein the shaft angle sensor comprises a resolver having rotor and stator coils for generating rotor and stator resolver signals corresponding to the tap changing shaft angle, said rotor and stator resolver signals comprising the shaft angle analog signals;

and wherein the analog-to-digital converter means comprises a resolver-to-digital converter having a plurality of inputs coupled to receive the resolver signals from the resolver.

5. The improved position angle transducer of claim 1 wherein the analog-to-digital converter means is programmed to generate at its outputs, a shaft angle digital words comprising digital word addresses corresponding to the tap changing shaft angles of the shaft of a tap changing transformer;

and wherein the digital-to-digital converter means comprises transfer function memory means comprising a plurality of shaft angle digital word address inputs and shaft angle digital word address memory locations, said transfer function memory means being programmed with said digitally encoded table for storing the plurality of tap number digital words at the shaft angle digital word address memory locations, said transfer function memory means thereby being programmed to deliver at the outputs tap number digital words corresponding to the shaft angle digital word addresses according to the transfer function or functional relationship of tap changing shaft angle to tap number for the particular tap changing transformer.

6. The improved position angle transducer of claim 5 wherein the transfer function memory means comprises a programmable read-only memory.

7. The improved position angle transducer of claim 6 wherein the programmable read-only memory is programmed for changing the slope of the transfer function or functional relationship of tap changing shaft angle to tap number for the particular tap changing transformer.

8. The improved position angle transducer of claim 6 wherein the programmable read-only memory is programmed for transforming the transfer function to concentrate the tap numbers represented by tap number digital words for presentation or display in an arc smaller than the arc spanned by the tap changing shaft angles represented by the shaft angle digital word addresses.

9. The improved position angle transducer of claim 5 wherein the transfer function memory means is programmed for specifying a desired transformation of the transfer function.

10. The improved position angle transducer of claim 1 wherein the digital-to-digital converter means comprises a read-only memory.

11. The improved position angle transducer of claim 3 wherein the synchro rotor coil is mechanically coupled to the rotatable shaft for rotation relative to the stator coils with said shaft, said rotor coil electrically coupled to the line voltage to provide reference synchro signals, and wherein the stator coils are electrically coupled to generate variable synchro signals according to the tap changing shaft angle.

12. The improved position angle transducer of claim 2 further comprising buffer output means coupled to the digital-to-analog converter means, said buffer output means comprising a low impedance substantially constant current source.

13. An improved position angle transducer for voltage compensating tap changing or variable tap transformers having a rotatable shaft for changing the secondary tap of the transformer in response to load demand to different secondary tap positions or tap numbers, a prime mover for rotating the shaft through different tap changing shaft angles in response to control signals, a synchronous generator having rotor and stator coils for generating synchro rotor and stator signals, said synchronous generator rotor coil being mechanically coupled to the rotatable shaft of the variable tap transformer for generating reference rotor signals and variable stator signals according to the tap changing shaft angle, each tap changing transformer being characterized by a transfer function or functional relationship of the tap changing shaft angle to tap number, the improvement comprising:

synchro to digital converter means having inputs coupled to receive the synchro signals from the synchronous generator and programmed to generate at the output digital word addresses corresponding to and representing the tap changing shaft angles of the rotatable shaft of a variable tap transformer;

computer program means operatively programmed for automatically converting empirically determined transfer function data correlating shaft angle and tap number for a particular variable tap transformer to a digitally encoded transfer function table correlating shaft angle and digital word tap numbers for said variable tap transformer;

transfer function memory means comprising a plurality of digital word address inputs and corresponding digital word address memory locations, said transfer function memory means being operatively programmed with said digitally encoded transfer function table for the variable tap transformer for storing the digital word tap numbers at said digital word address memory locations corresponding to the different tap changing shaft angles of the rotatable shaft of the particular variable tap transformer, said transfer function memory means comprising a plurality of outputs for delivering said digital word tap numbers according to the transfer function or functional relationship of tap changing shaft angle to tap number for said particular variable tap transformer;

and digital to analog converter means operatively coupled for converting the tap number digital words at the output of the transfer function memory means to tap number analog signals corresponding to the tap number selected by the tap changing angle of the rotatable shaft of the variable tap transformer.

14. The improved position angle transducer of claim 13 wherein the transfer function memory means is further encoded for specifying any desired transformation of the transfer function or functional relationship to the tap changing shaft angle of the rotatable shaft to tap number.

15. The improved position angle transducer of claim 13 further comprising buffer output means coupled to the digital to analog converter means, said buffer output means comprising a low impedance substantially constant current source output.

16. The improved position angle transducer of claim 15 wherein said buffer output means comprises an operational amplifier followed by an instrument amplifier and a resistance, said substantially constant current output being generated by the instrument amplifier across said resistance.

17. The improved position angle transducer of claim 13 wherein said transfer function memory means comprises a programmable read-only memory encoded according to the transfer function or functional relationship of the tap changing angle of the rotatable shaft to tap number for a particular variable tap transformer.

18. The improved position angle transducer of claim 13 wherein the control signals for the prime mover comprise SCADA System control signals operatively coupled to the prime mover and wherein the tap number analog signals from the digital-to-analog converter means are coupled to the SCADA System.

19. The improved position angle transducer of claim 13 wherein the tap number analog signal is a current signal.

20. The improved position angle transducer of claim 14 wherein the computer program means is operatively programmed for entering shaft angles as discontinuities in the transfer function.

21. An improved method for generating tap number or tap position data output signals for a tap changing transformer from tap changing shaft angle analog signals, where the transformer has a rotatable shaft for changing the secondary tap to different secondary tap positions or tap numbers, a shaft motor for rotating the shaft through different tap changing shaft angles, a shaft angle sensor operatively coupled for generating shaft angle analog signals corresponding to the tap changing shaft angle, and wherein the transformer is characterized by a transfer function or functional relationship of the tap changing shaft angle to tap number, the improved method comprising:

empirically determining transfer function data correlating shaft angle and tap number for a particular tap changing transformer;

automatically converting the empirically determined transfer function data to a digitally encoded transfer function table correlating shaft angle and tap number digital words for the tap changing transformer;

converting the shaft angle analog signals from the shaft angle sensor of the tap changing transformer to shaft angle digital words;

converting the shaft angle digital words to tap number digital words representing tap numbers corresponding to the shaft angle digital words and tap changing shaft angles, according to the digitally encoded transfer function table for the particular tap changing transformer;

converting the tap number digital words to tap number output signals;

and buffering said output signals to provide low impedance substantially constant current tap number output signals.

22. The method of claim 21 wherein the step of converting the shaft angle analog signals to shaft angle digital words comprises converting the shaft angle analog signals to shaft angle digital word addresses;

and wherein the step of converting the shaft angle digital words to tap number digital words comprises storing tap number digital words at a plurality of memory locations having shaft angle digital word addresses, said tap number digital words being derived from the digitally encoded transfer function table for the particular tap changing transformer, and retrieving the tap number digital words from memory locations designated by the shaft angle digital word addresses.

23. The method of claim 21 further comprising the step of transforming the transfer function or functional relationship of the tap changing shaft angle to tap number to a specified new function.

* * * * *